United States Patent [19]

Bryant et al.

[11] Patent Number: 5,065,225
[45] Date of Patent: Nov. 12, 1991

[54] TUNNELING DIFFUSION BARRIER FOR LOCAL INTERCONNECT AND POLYSILICON HIGH IMPEDANCE DEVICE

[75] Inventors: Frank R. Bryant, Denton; John L. Walters, Carrollton, both of Tex.

[73] Assignee: SGS-Thomson Microelectronics, Inc., Carrollton, Tex.

[21] Appl. No.: 560,384

[22] Filed: Jul. 31, 1990

[51] Int. Cl.$^5$ .................. H01L 23/48; H01L 49/02; H01L 27/02; H01L 29/04
[52] U.S. Cl. .......................................... 357/71; 357/6; 357/51; 357/59
[58] Field of Search .................... 357/6, 51, 59, 71

[56] References Cited

U.S. PATENT DOCUMENTS

| | | | |
|---|---|---|---|
| 4,641,173 | 2/1987 | Malhi et al. | 357/6 |
| 4,935,378 | 6/1990 | Mori | 357/71 |
| 4,935,801 | 6/1990 | McClure et al. | 357/71 |
| 4,935,804 | 6/1990 | Ito et al. | 357/71 |
| 4,937,643 | 6/1990 | Deslauriers et al. | 357/71 |
| 4,939,567 | 7/1990 | Kenney | 357/71 |
| 4,948,755 | 8/1990 | Mo | 357/71 |

OTHER PUBLICATIONS

R. Atlan, "Thin-Film Devices on Silicon Chip withstand up to 500° C.," Electronics Review, Jan. 3, 1980, pp. 39–40.

Primary Examiner—Andrew J. James
Assistant Examiner—Cynthia S. Deal
Attorney, Agent, or Firm—Lisa K. Jorgenson; Richard K. Robinson

[57] ABSTRACT

A semiconductor device is described in which a conductive layer overlaps a dielectric layer forming a composite electrical device deposited over selected portions of a semiconductor substrate chemically isolating the conductive layer portion of the composite electrical device from the substrate, thereby preventing difffusion of dopant material through the dielectric layer into and out of the conductive layer while simultaneously allowing for tunneling of electrons through the dielectric layer to and from the conductive layer and the semiconductor substrate.

7 Claims, 3 Drawing Sheets

TUNNELING DIFFUSION BARRIER FOR LOCAL INTERCONNECT AND POLYSILICON HIGH IMPEDANCE DEVICE

TECHNICAL FIELD

The present invention relates generally to semiconductor devices, in particular, to complex semiconductor devices called integrated circuits, and more particularly to tunneling diffusion barriers for local interconnect and polysilicon high impedance devices for use in integrated circuits.

BACKGROUND OF THE INVENTION

There are a large number and variety of basic fabrication steps used in the production of modern semiconductor devices. In order to fabricate a circuit consisting of thousands of components on a single silicon substrate, the movement of electrons is critical to the proper functioning of each device according to specified design rules. The production of electrons and associated holes enhancing the electrical characteristics of an given semiconductor device fabricated on the surface of a silicon wafer can be further enhanced by introducing controlled quantities of impurities or doping material. Doping elements such as phosphorus, arsenic, and antimony create n-type substrates while doping elements such as boron, indium, gallium, or aluminum create p-type substrates. Free electrons will move from a n-type substrate to a p-type substrate created by the doping process.

A limitation in the electrical characteristics of a device arises when doped polysilicon is deposited by chemical vapor deposition over a layer of silicon substrate. This process is used in forming a silicon gate. While the electrical devices created from the deposition of the doped polysilicon such a high impedance devices or local interconnects allow for conduction of electrons the dopant material from the polysilicon layer will migrate into an adjoining layer. Any migration of dopant material will ultimately change the electrical characteristics of the devices such as the resistance value of the high impedance device, determined by the dimension of the high impedance device, and the dopant level within the region creating the high impedance device. The fabrication of one type of semiconductor device, an electrical conductive contact and associated interconnect layers is described in US Patent Application Ser. No. 502,526 filed Mar. 30, 1990 to Nicholls et. al and entitled "Semiconductor Devices and Fabrication Thereof." A method of fabricating an insulating layer of silicon dioxide as part of an overall process of fabricating conductive or semiconductive layers to form a contact is described in U.S. Pat. No. 4,877,483 issued Oct. 31, 1989 to Bergemont et. al.

Another limitation arises where a layer of aluminum is deposited by chemical vapor deposition over a silicon substrate. Junction spiking results when aluminum atoms pass through the underlying silicon substrate into the layer beneath the silicon substrate. This junction spiking causes a hole and disrupts the junction between the silicon substrate and the layer beneath the silicon substrate resulting in a short circuit condition.

A further limitation arises where a dielectric or insulator exists between a doped polysilicon or aluminum layer and the underlying silicon substrate. A dielectric may provide enough resistance to prevent tunneling of electrons through the dielectric to or from the doped polysilicon or aluminum layer and into or out of the underlying silicon substrate. Tunneling of electrons does occur, however, where the dielectric is thin enough to allow current to flow across the dielectric. Tunneling currents are discussed in the IEEE Transaction On Electron Devices, Vol. 37, No. Aug. 8, 1990 in an article entitled "Thickness Limitation of $SiO_2$ Gate Dielectrics for MOS ULSI"; in S. Pantelides, *Physics Of $SiO_2$ And Its Interfaces,* (1978) in an article by M. Avron, et. al at pp. 47-51 entitled "The Nature Of Electron Tunneling In $SiO_2$"; and, in R. Muller, T. Kamis, *Device Electronics For Integrated Circuits,* Section 3.4 "Junction Breakdown" (1977). The electrical properties of silicon nitride as taught in the present invention are discussed in general in the 1987 ECS Symposium Proceeding entitled "Silicon Nitride And Silicon Dioxide Thin Insulating Films" in an article entitled "Electrical Properties Of Thin LPCVD $Si_3N_4$ Films On Mono-And Polycrystalline Silicon."

SUMMARY OF THE INVENTION

In accordance with the present invention, a semiconductor device is disclosed in which the device is an electrical element covered over a thin dielectric layer which is further disposed over a substrate layer allowing for tunneling of electrons through the dielectric layer into and out of the electrical element while simultaneously preventing the diffusion of dopant material through the dielectric layer into and out of the electrical element.

A feature of the invention is a thin dielectric layer deposited between the conductive electrical element layer of the composite electrical device and the substrate to facilitate tunneling of electrons while simultaneously preventing the diffusion of the dopant material between the conductive layer and the substrate.

DETAILED DESCRIPTION OF THE INVENTION

Figure 1:
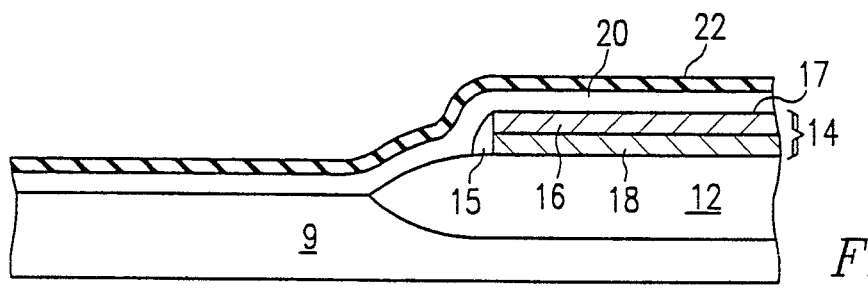
FIG. 1 is a schematic sectional view illustrating a portion of an integrated circuit device of the present invention at one stage in a process for making the devices.

Referring to FIG. 1 there is shown a cross section of a portion of an integrated circuit device of the present invention, indicated generally by the reference numeral 10. The device 10 includes a substrate layer 9 as known in the art. The device 10 comprises an isolation field oxide layer 12 positioned below and adjacent to gate 14. Gate 14 comprises two layers, a silicide layer 16 superimposed on a conductive layer 18. A sidewall oxide space 15 as known in the art is adjacent to the silicide layer 16 and conductive layer 18. A silicon dioxide layer 20 is deposited on top surface 17 of gate 14.

Photoresist pattern 22 is deposited on the silicon dioxide layer 20 using standard photoresist techniques, after which the unmasked portions of layer 22 are etched away using an etchant which selectively attacks the oxide.

Figure 2:
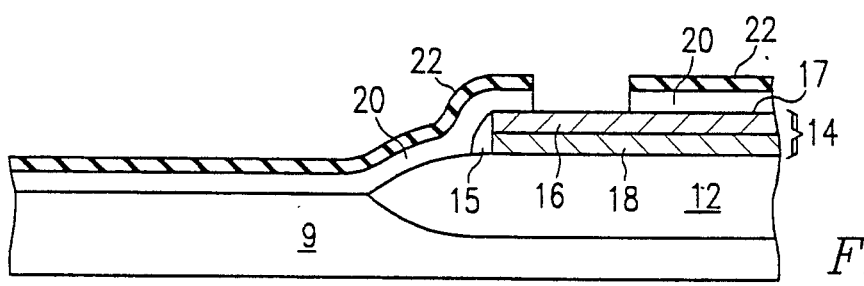
FIG. 2 is a schematic sectional view illustrating a succeeding step in the process.

Referring to FIG. 2, the etching process thereby removes the exposed silicon dioxide portions between the remaining layer 20 as shown. Following the etching step, an ion implant step is performed in a known manner, if necessary, to protect the integrity of the etched opening.

Figure 3:
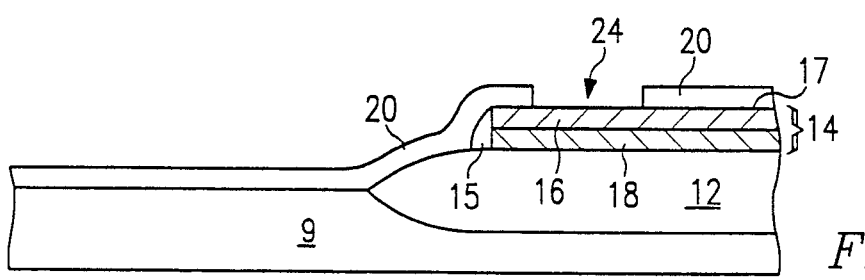
FIG. 3 is a schematic sectional view illustrating a succeeding step in the process.

Referring to FIG. 3, the photoresist layer 22 is removed using known techniques thereby leaving a contact opening 24 and remaining silicon dioxide layer 20.

Figure 4:
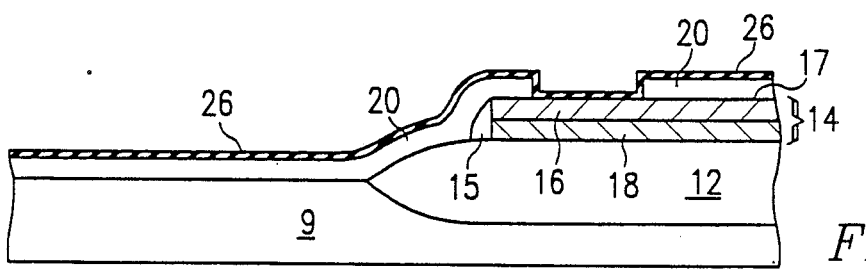
FIG. 4 is a schematic sectional view illustrating a succeeding step in the process.

Referring to FIG. 4, a silicon nitride layer 26 ($Si_3H_4$) is deposited on silicon dioxide layer 20 and silicide layer 16 at contact opening 24 by chemical vapor deposition by heating dichlorosilane and ammonia at approximately 700° C. to produce silicon nitride, hydrogen, and hydrogen chloride gas having a thickness range of between 5 Angstroms and 50 Angstroms. At the thickness range of about 5 Angstroms to about 50 Angstroms, the silicon nitride layer 26 will allow tunneling of electrons through layer 26. The current flow through layer 26 is a function of the area of the silicon nitride layer 26, the thickness of the silicon nitride layer 26, the activation energy required for the electrons to cross the silicon nitride layer 26 at surface interface 17 of gate 14, and the probability that each electron from silicide layer 16 of gate 14 actually crosses surface 17 and tunnels through the silicon nitride layer 26. While the silicon nitride layer 26 permits tunneling of electrons through the silicon nitride layer 26, the silicon nitride layer 26 continues to perform as a barrier prohibiting diffusion of dopant material through the layer from silicide layer 16 of gate 14. The silicon nitride layer 26 is, however, thin enough to allow electrical currents to flow through the layer to or from adjacent layers.

Figure 5:
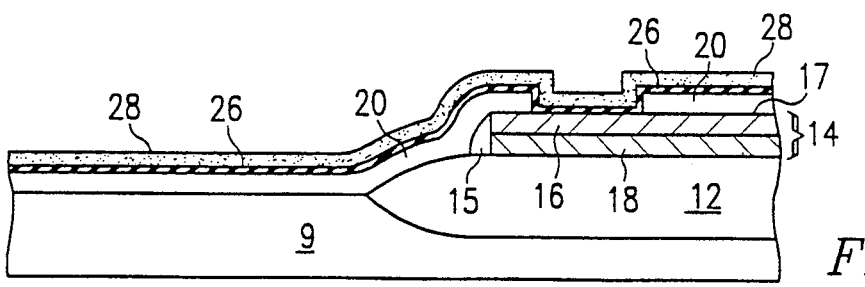
FIG. 5 is a schematic sectional view illustrating an alternative succeeding step in the process.

Referring to FIG. 5, to form a local interconnect, polysilicon layer 28 is deposited on silicon nitride layer 26. Polysilicon is deposited by known chemical vapor deposition methods by heating silane at around 600° C., releasing hydrogen gas from silane and depositing silicon. Polysilicon layer 28 is then doped with an appropriate p-type dopant by known diffusion or implantation methods. The next step is to deposit a silicide layer 30 on polysilicon layer 28 by known deposition methods. The silicon nitride layer 26 prohibits the dopant material in local interconnect film 28 from diffusing through the silicon nitride layer 26 into silicide layer 16 of gate 14.

Figure 6:
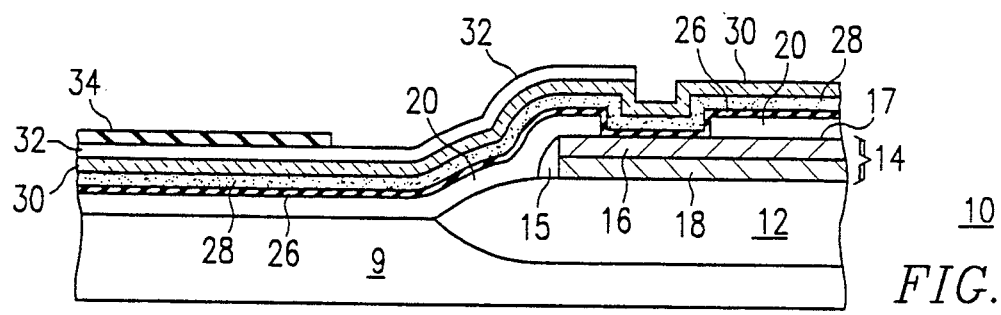
FIG. 6 is a schematic sectional view illustrating a succeeding step in the process.

Referring to FIG. 6, a second silicon dioxide layer 32 is thermally grown on top of silicide layer 30. A second photoresist pattern 34 is deposited on the second silicon dioxide layer 32, using standard photoresist techniques, after which the unmasked portions of layer 34 are etched away using an etchant which selectively attacks oxide.

Figure 7:
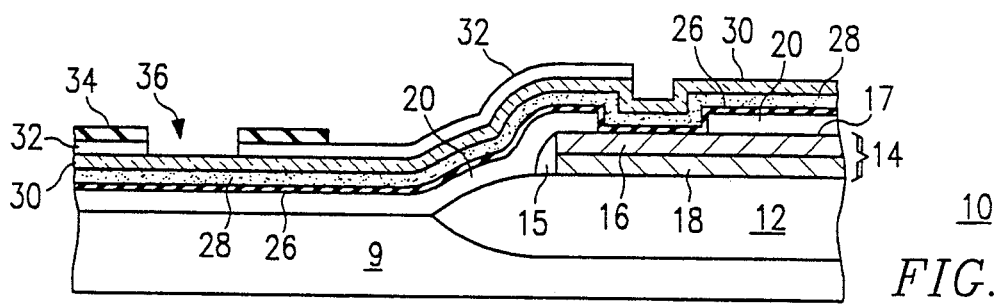
FIG. 7 is a schematic sectional view illustrating a succeeding step in the process.

Referring to FIG. 7, the etching process performed in a known manner thereby removes the second photoresist layer 34 and second silicon dioxide layer portions between the remaining layer 32 as shown thereby leaving an opening 36. Following the etching step, an ion implant step is performed in a known manner, if necessary, to protect the integrity of the etched opening.

Figure 8:
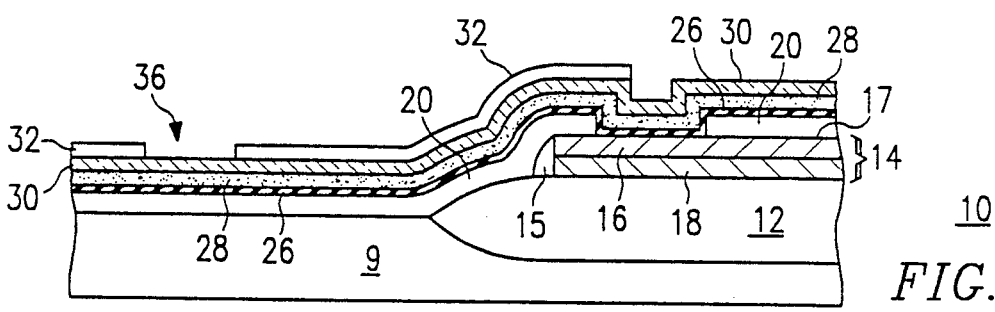
FIG. 8 is a schematic sectional view illustrating a succeeding step in the process.

Referring to FIG. 8, the photoresist layer 34 is next removed using known techniques.

Figure 9:
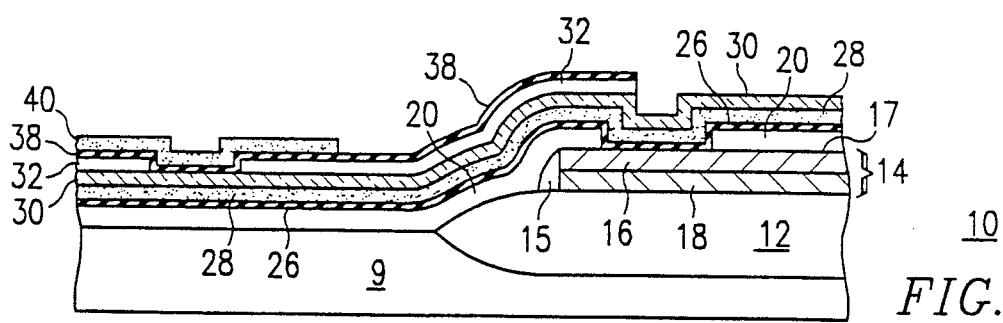
FIG. 9 is a schematic sectional view illustrating a succeeding step in the process.

Referring to FIG. 9, a second silicon nitride layer 38 is deposited on the second silicon dioxide layer 32 and the silicide layer 30 at opening 36 by chemical vapor deposition in a known manner having a thickness range of about 5 Angstroms to about 50 Angstroms. At the specified thickness range, the silicon nitride layer 38 will allow tunneling of electrons through layer 38.

A second polysilicon layer 40 is deposited on second silicon nitride layer 38. The second polysilicon layer 40 is doped with an appropriate p-type dopant or lightly doped n-type dopant by known diffusion methods to form a high impedance device with a known resistance value. The second silicon nitride layer 38, acting as a barrier, prohibits the dopant material in second polysilicon layer 40 from diffusing through the second silicon nitride layer 38 into the silicide layer 30. This barrrier prevents alteration of the high impedance device value through dopant diffusion into or out of the high impedance device.

Figure 10:
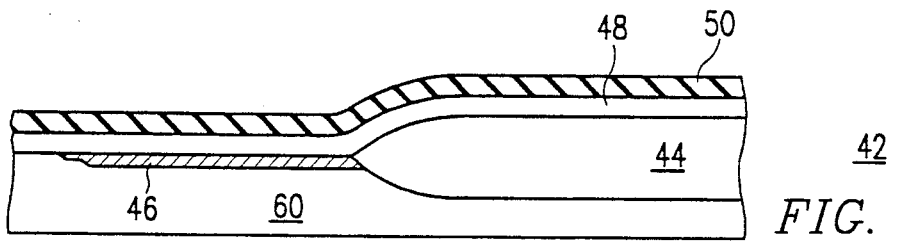
FIG. 10 is a schematic sectional view illustrating a portion of an integrated circuit device of the present invention at one stage in a process for making the devices.

Referring to FIG. 10, there is shown a cross-section of a portion of an integrated circuit device of the present invention, indicated generally by the reference numeral 42. The device 42 comprises an isolation field oxide layer 44 and substrate layer 60 as known in the art. The device 42 further comprises an active region 46 adjacent to isolation field oxide layer 44. A silicon dioxide layer 48 is deposited on isolation field oxide layer 44 and active region 46.

Photoresist pattern 50 is deposited on the silicon dioxide layer 48 using standard photoresist techniques, after which the unmasked portions of layer 50 are etched away using an etchant which selectively attacks oxide.

Figure 11:
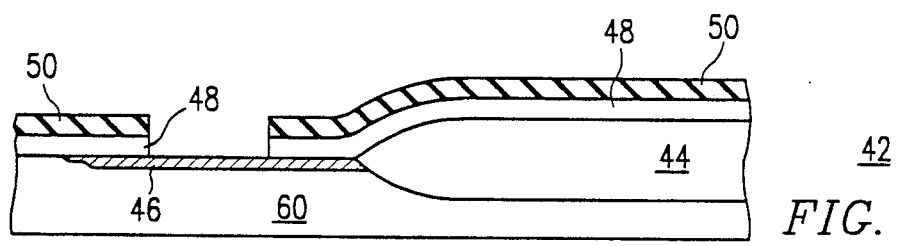
FIG. 11 is a schematic sectional view illustrating a succeeding step in the process.

Referring to FIG. 11, the etching process thereby removes the exposed silicon dioxide portions between the remaining layer 48 as shown.

Figure 12:
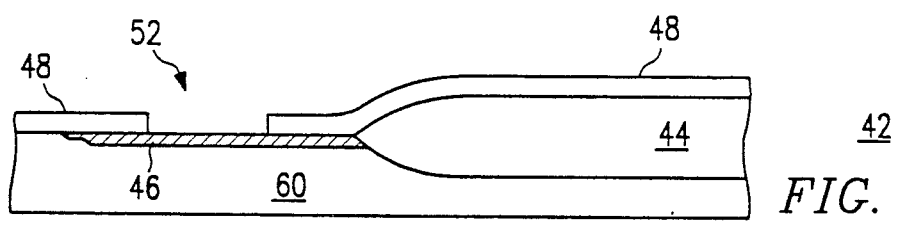
FIG. 12 is a schematic sectional view illustrating a succeeding step in the process.

Referring to FIG. 12, the photoresist layer 50 is removed using known techniques thereby leaving a contact opening 52 and remaining silicon dioxide layer 48.

Figure 13:
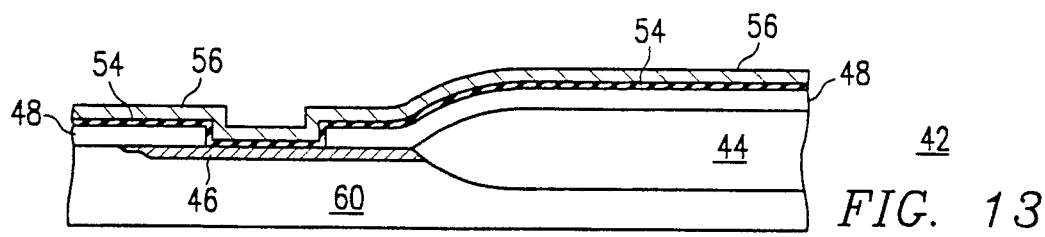
FIG. 13 is a schematic sectional view illustrating a succeeding step in the process.

Referring to FIG. 13, a silicon nitride ($Si_3 H_4$) layer 54 is deposited on an active region 46 at contact opening 52 and the remaining silicon dioxide layer 48 by chemical vapor deposition having a thickness range of between 5 Angstroms and 50 Angstroms.

An interconnect film 56 comprising aluminum is deposited on silicon nitride layer 54. Aluminum is deposited by various known methods. Silicon nitride layer 54 prevents junction spiking from aluminum interconnect film 56 through the silicon nitride layer 54, across substrate 56 and into an substrate layer 60 underlying substrate 56; thereby preventing a short circuit across the junction of substrate 56 and substrate layer 60. The various fabrication methods such at etching, chemical vapor deposition, ion implantation, and photoresist techniques are well known in the art. The following references may be referred to for detailed descriptions of fabrication methods: W. Maly, *Atlas of IC Technologies, An Introduction To VLSI Process*, (1987); J. A. Cunningham, *CMOS Technology*, (1987); P. Van Zant, *Microchip Fabrication, A Practical Guide To Semiconductor Processing*, (2nd ed. 1990).

What is claimed is:

1. An interconnect of an integrated circuit comprising;
   a first silicon layer having a first conductivity type;
   an insulating layer disposed over the first silicon layer with an opening to expose selected regions in the first silicon layer;
   a barrier insulating layer covering exposed regions in the first silicon layer and portions of the insulating layer, wherein the barrier insulating layer has a thickness sufficient to facilitate conduction of electrons through the barrier layer; and,
   a second polysilicon layer having a second conductivity type disposed over the barrier insulating layer.

2. The device of claim 1, wherein the first silicon layer is a substrate.

3. The device of claim 1 wherein the first silicon layer is polysilicon.

4. The device of claim 1, wherein the second polysilicon layer is a silicided polysilicon.

5. The device of claim 1, wherein the barrier layer is silicon nitride with a thickness between approximately 5 to 50 Angstroms to prevent the diffusion of dopant material between the first silicon layer and the second polysilicon layer.

6. The device of claim 1, wherein the first conductivity type is n-type and the second conductivity type is p-type.

7. The device of claim 1, wherein the first conductivity type is p-type and the second conductivity type is n-type.

* * * * *